US011242241B2

(12) United States Patent
Menon et al.

(10) Patent No.: US 11,242,241 B2
(45) Date of Patent: Feb. 8, 2022

(54) SYSTEMS AND METHODS FOR MICRO-CANTILEVER ACTUATION BY BASE EXCITATION

(71) Applicant: INTREPID VISIONS INC., Coquitlam (CA)

(72) Inventors: Carlo Menon, Coquitlam (CA); Mojtaba Komeili, Calgary (CA)

(73) Assignee: INTREPID VISIONS INC., Coquitlam (CA)

(*) Notice: Subject to any disclaimer, the term of this patent is extended or adjusted under 35 U.S.C. 154(b) by 585 days.

(21) Appl. No.: 15/744,575

(22) PCT Filed: Jul. 13, 2016

(86) PCT No.: PCT/CA2016/050828
§ 371 (c)(1),
(2) Date: Jan. 12, 2018

(87) PCT Pub. No.: WO2017/008164
PCT Pub. Date: Jan. 19, 2017

(65) Prior Publication Data
US 2018/0201497 A1 Jul. 19, 2018

Related U.S. Application Data

(60) Provisional application No. 62/191,593, filed on Jul. 13, 2015, provisional application No. 62/259,162, filed on Nov. 24, 2015.

(51) Int. Cl.
*B81B 3/00* (2006.01)
*G02B 26/10* (2006.01)
(Continued)

(52) U.S. Cl.
CPC ............ *B81B 3/0024* (2013.01); *B81B 7/02* (2013.01); *F03G 7/065* (2013.01); *G02B 26/103* (2013.01);
(Continued)

(58) Field of Classification Search
CPC ... B81B 3/0024; B81B 7/02; B81B 2201/031; B81B 2203/053; F03G 7/065; G02B 26/103; H01H 2061/006
(Continued)

(56) References Cited

U.S. PATENT DOCUMENTS 5,903,380 A * 5/1999 Motamedi ............ B81B 3/0035
359/202.1
6,625,004 B1 * 9/2003 Musolf .................. B82Y 30/00
361/277
(Continued)

FOREIGN PATENT DOCUMENTS

GB       2389457 A       12/2003
JP    H5-173088 A        7/1993
(Continued)

OTHER PUBLICATIONS

Bouwstra et al. (Jun. 1, 1993). "Thermal base drive for micromechanical resonators employing deep-diffusion bases," Sensors and Actuators A: Physical 37-38:38-44.
(Continued)

*Primary Examiner* — Bryan P Gordon
(74) *Attorney, Agent, or Firm* — Morrison & Foerster LLP

(57) ABSTRACT

A system and methods for base excitation of moderately high vibration of micro-cantilevers are disclosed. A micro-cantilever may be coupled to one or more actuators adjacent its base. The actuators may comprise bulk materials, bridges, or formed wires that expand and contract by application of
(Continued)

electric currents, due to, for example, the effect of electrothermal heating or piezoelectric effects. Single actuators or an array of actuators may be placed around the micro-cantilever to oscillate it and apply actuation pulses. The system and methods, and adjustments of the geometrical parameters, may be performed to yield a nominal natural frequency in the system. The excitation of actuators with signals corresponding to the natural frequency may induce resonance in the system and may result in high amplitude vibrations and displacement of the cantilever tip of the micro-cantilever. Various architectures of the actuators may be implemented to stimulate different frequencies of the beam and induce displacement in different direction and amplitudes.

32 Claims, 19 Drawing Sheets

(51) Int. Cl.
   *B81B 7/02* (2006.01)
   *F03G 7/06* (2006.01)
   *H01H 61/00* (2006.01)

(52) U.S. Cl.
   CPC ... *B81B 2201/031* (2013.01); *B81B 2203/053* (2013.01); *H01H 2061/006* (2013.01)

(58) Field of Classification Search
   USPC .................. 310/307, 309, 328, 348, 800
   See application file for complete search history.

(56) References Cited

U.S. PATENT DOCUMENTS

| | | | | |
|---|---|---|---|---|
| 2003/0048170 | A1* | 3/2003 | Bromley | H01H 1/0036 337/333 |
| 2003/0234835 | A1* | 12/2003 | Torii | H01L 41/0973 347/68 |
| 2006/0006484 | A1* | 1/2006 | Seneviratne | B81B 3/0016 257/415 |
| 2006/0122565 | A1 | 6/2006 | Kooi | |
| 2007/0034818 | A1* | 2/2007 | Grummon | F03G 7/065 251/129.01 |
| 2008/0129796 | A1* | 6/2008 | McAvoy | B41J 2/14427 347/61 |
| 2008/0218968 | A1* | 9/2008 | Bhattacharya | H01L 41/094 361/695 |
| 2008/0238256 | A1* | 10/2008 | Leija | F04D 33/00 310/328 |
| 2009/0203000 | A1* | 8/2009 | Mutharasan | G01N 33/54373 435/6.12 |
| 2010/0001616 | A1 | 1/2010 | Ferreira et al. | |
| 2010/0123775 | A1* | 5/2010 | Shibasaki | H04N 5/2354 348/68 |
| 2011/0089787 | A1* | 4/2011 | Takahashi | F03G 7/005 310/348 |
| 2011/0156528 | A1* | 6/2011 | Hong | B81B 3/0029 310/300 |
| 2011/0169372 | A1* | 7/2011 | Lim | H01L 37/02 310/307 |
| 2012/0198835 | A1* | 8/2012 | Skurkis | F16G 11/02 60/527 |
| 2012/0326564 | A1* | 12/2012 | Takahashi | F03G 7/005 310/328 |
| 2013/0088764 | A1* | 4/2013 | Cha | H01L 41/082 359/197.1 |
| 2013/0271806 | A1* | 10/2013 | Friese | B81B 7/02 359/221.2 |
| 2015/0203345 | A1* | 7/2015 | Sachin | B81B 3/0021 257/415 |
| 2019/0317316 | A1* | 10/2019 | Ogata | G02B 6/0006 |

FOREIGN PATENT DOCUMENTS

| | | |
|---|---|---|
| JP | H7-266428 A | 10/1995 |
| JP | H9-96552 A | 4/1997 |
| JP | 2000-41385 A | 2/2000 |
| JP | 2008-504574 A | 2/2008 |
| JP | 2009-524065 A | 6/2009 |
| JP | 2014-515483 A | 6/2014 |
| WO | 2006/002388 A1 | 1/2006 |
| WO | 2007/087328 A2 | 8/2007 |
| WO | 2008/020903 A2 | 2/2008 |
| WO | 2011/001138 A1 | 1/2011 |
| WO | 2012/160393 A1 | 11/2012 |

OTHER PUBLICATIONS

Decision to Grant a Patent dated Feb. 7, 2020, directed to JP Application No. 2018-521452; 6 pages.
Extended European Search Report dated Feb. 21, 2019, directed to EP Application No. 16823599.2; 8 pages.
International Preliminary Report on Patentability dated Jan. 16, 2018, directed to International Application No. PCT/CA2016/050828; 6 pages.
International Search Report and Written Opinion dated Sep. 19, 2016, directed to International Application No. PCT/CA2016/050828; 8 pages.
Notice of Allowance dated Feb. 26, 2020, directed to CA Application No. 2,992,105; 1 page.
Office Action dated Apr. 8, 2019, directed to JP Application No. 2018-521452; 7 pages.
Office Action dated Aug. 13, 2019, directed to JP Application No. 2018-521452; 4 pages.
Office Action dated Oct. 19, 2018, directed to CA Application No. 2,992,105; 3 pages.
Weber et al. "Tunable Mems Fiber Scanner for Confocal Microscopy," IEEE 27th International Conference on Electro Mechanical Systems (MEMS), Jan. 26-30, 2014, San Francisco, California, USA; pp. 881-884.
Office Action dated Jul. 6, 2020, directed to EP Application No. 16 823 599.2; 5 pages.
Hashiguchi et al., (Apr. 2003) "A Micromachined Nano tweezers Integrated with a Thermal Expansion Micro Actuator," Journal of Electric Engineers, General Incorporated Electric Society 123(1): 1-8.
Notice of Reasons for Refusal dated Apr. 16, 2021, directed to JP Application No. 2020-035950; 12 pages.
Office Action dated Nov. 12, 2021, directed to EP Application No. 16 823 599.2; 4 pages.

* cited by examiner

SYSTEMS AND METHODS FOR MICRO-CANTILEVER ACTUATION BY BASE EXCITATION

CROSS-REFERENCE TO RELATED APPLICATION

The present application is the national stage of International Application No. PCT/CA2016/050828 filed internationally on Jul. 13, 2016, which claims priority to U.S. Provisional Application Ser. No. 62/191,593 filed on Jul. 13, 2015, entitled "BASE EXCITED MICRO-CANTILEVER", and to U.S. Provisional Application Ser. No. 62/259,162 filed on Nov. 24, 2015, entitled "ROBUST DESIGN OF RESONANT VIBRATING BASE-DRIVEN MICRO-CANTILEVER, each of which is hereby incorporated by reference in their entirety for all purposes.

FIELD

The present disclosure relates generally to the field of Micro-Electro-Mechanical System (MEMS) structures and methods of actuation and, more particularly, to micro-cantilever structures and methods of actuation.

BACKGROUND

Micro-cantilevers are one of the most widely used structures in micro-electromechanical systems (MEMS), and are used as actuators for various purposes. In general, the resonance excitation of micro-cantilevers is a common practice in the industry, and there are various techniques to actuate MEMS devices to vibrate at high frequencies. Typical actuation methods include thermal, electrostatic, electromagnetic, and piezoelectric activation.

Thermal activation, based on thermal expansion of a component during heating, offers advantages of relatively simple implementation and relatively large forces and displacements being applied to a micro-cantilever, and can allow high vibration frequencies on the order of hundreds of MHz. Thermal activation methods have typically employed a layered bimorph micro-cantilever structure in order to effect bending directly in the cantilever. However, the technique of base excitation, wherein the cyclic deformation or motion of actuators attached near the base of a micro-cantilever causes vibration of the cantilever tip, offers the potential of improved actuation efficiency due to practical resonance excitation of the cantilever, but this technique has typically been used only with non-thermally activated actuation methods.

Thus, it is desirable to methods and systems comprising a micro-cantilever actuator system that combines the efficient and practical features of both thermal actuation and base excitation techniques to allow high frequency micro-cantilever vibration. Applications for such a micro-cantilever system include, for example, wafer probes, bio-sensors, and imaging probes.

SUMMARY

Described here are variations of systems and methods for micro-cantilever actuation by base excitation. One or more variations are directed to a micro-electro-mechanical system comprising a micro-cantilever coupled near its base to an array of one or more actuators. In one or more variations, the micro-cantilever comprises a free end, or tip, which may be induced to high frequency vibration by base excitation caused by cyclic activation of the actuator array. The expansion and contraction cycles of the actuator array provide small perturbations in the micro-cantilever system that may accumulate over a short period of time and result in high amplitude vibrations, due to resonance at the natural frequency of the system. Variations using this technique may provide high magnification factors in the ratio of input displacement at the actuator to micro-cantilever tip displacement. Control of the natural frequencies of the system is facilitated by the design and/or geometrical parameters, and may be designed for according to the needs of an application.

In one variation, an array of actuators may be located and disposed or coupled around the micro-cantilever beam or fiber, in order to allow vibration actuation in any arbitrary direction.

BRIEF DESCRIPTION OF THE DRAWINGS

Features will become apparent to those of skill in the art by describing in detail exemplary embodiments with reference to the attached drawings in which.

DETAILED DESCRIPTION

Reference will now be made in detail to implementations and embodiments of various aspects and variations of the invention, examples of which are illustrated in the accompanying drawings.

In the present specification, "quality factor" refers to a measure used to quantify energy losses and efficiency of a system, and may be defined generally as $2*pi*U\_s/U\_d$, where $U\_s$ is the maximum energy that can be stored in absence of losses, and $U\_d$ is the energy loss over one oscillatory cycle.

Figure 1:
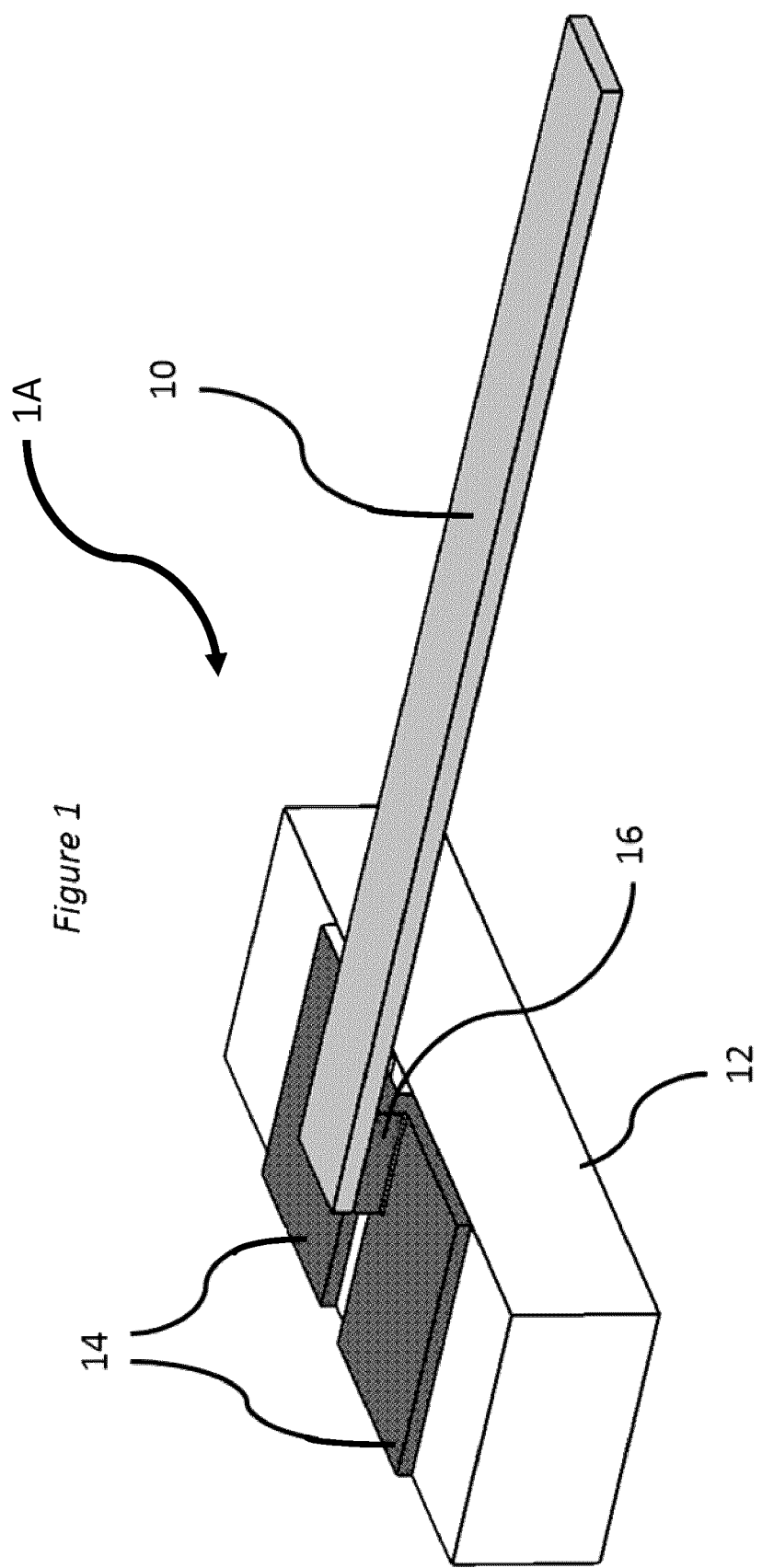
FIG. 1 illustrates a base excited micro-cantilever according to an embodiment.

As is shown in FIG. 1, an example of a system 1A for micro-cantilever actuation may include a micro-cantilever 10 disposed on top of an actuator 16 that may be coupled to a power source (not shown) through, for example, connecting connectors 14 (e.g., wires/lines). The system 1A is placed on top of a substrate material 12. The actuator 16 may be excited by the signals that are transmitted through wires 14. Two different approaches, for example, may be selected for actuation (1) thermal actuation; (2) piezoelectric effects. The latter implementation depends on the particular case of the design and limitations on heat, signal interference etc. In case of using heat generation as the main mechanism of actuation, conductor wires 14 act as heat sinks for facilitating relatively high frequency heating/cooling cycles of the actuator 16 material. It is proven that the frequency of heating and cooling cycles in MEMS devices can be up to tens or hundreds of MHz. In some variations, this design not only uses the base actuation technique but also the effect of interlayer forces between the actuator material and the layer of the beam connected to the actuator brings in some bimorph effect. This tension, from the bimorph effect, along the length of the beam may have considerable effect on this bending.

Figure 2:
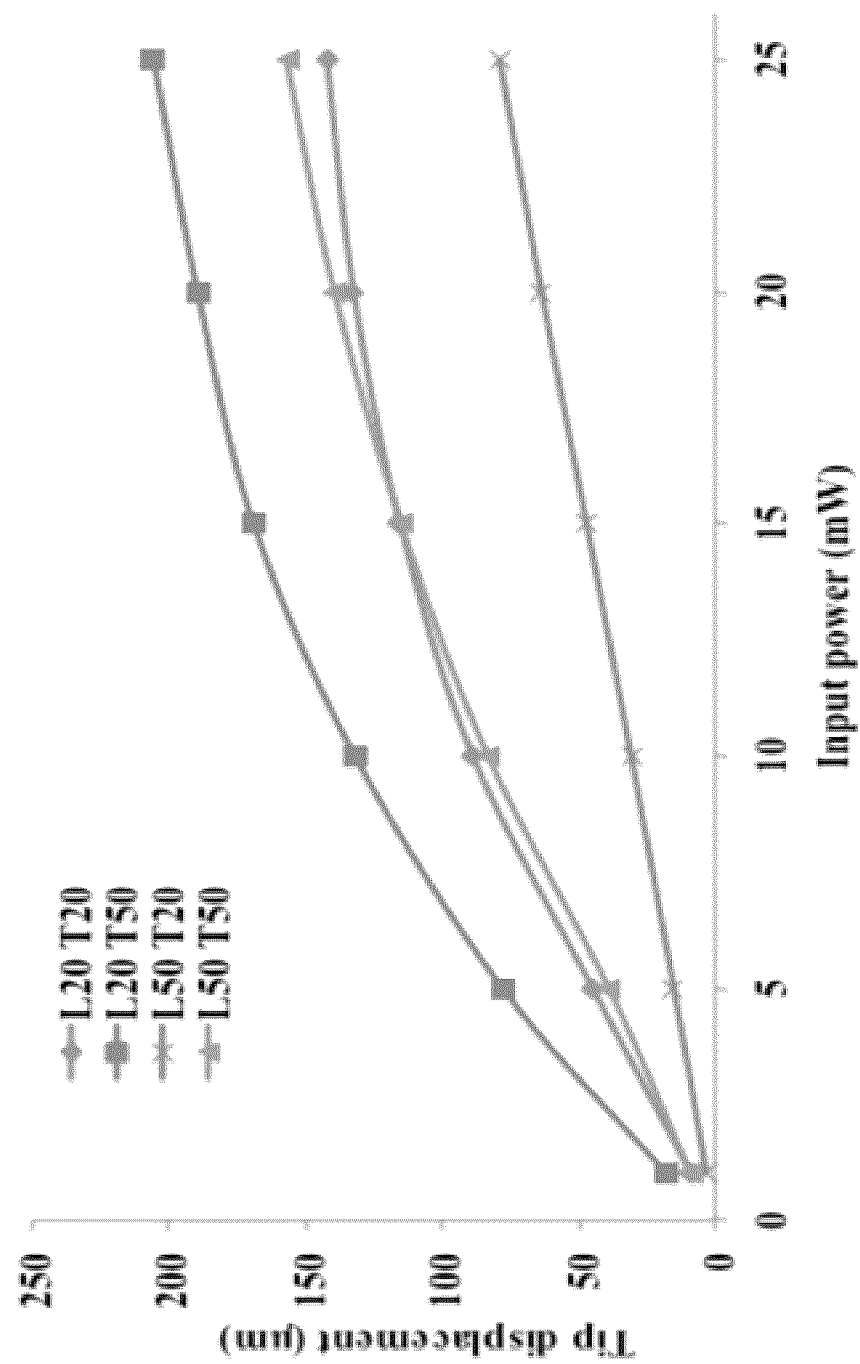
FIG. 2 illustrates the predicted relationship between input power to the actuator and micro-cantilever beam tip displacement according to several simulated embodiments.

FIG. 2 illustrates example performance curves calculated via numerical modeling of the system 1A depicted in FIG. 1. The thermal heating of the actuator 16 was the source of actuation in this analysis and the dimensions were optimized for about 8 kHz vibrations. The ANSYS commercial finite element package was used to create the models and extract outputs. The graphs show the amplitude of tip displacement for different magnitudes of the input power. The input power is applied as a joule heat generation effect on the on the actuator layer with semi-sinusoidal time dependency (i.e., only the positive part of the sine function was used and negative part was replaced by zero). The effect of actuator thickness and length are investigated in this graph. The figure legends show the thickness of the actuator (T) and its length along the micro-cantilever (L) for constant width value. This graph proved theoretical feasibility of the invention and methods to optimize it.

Figure 3:
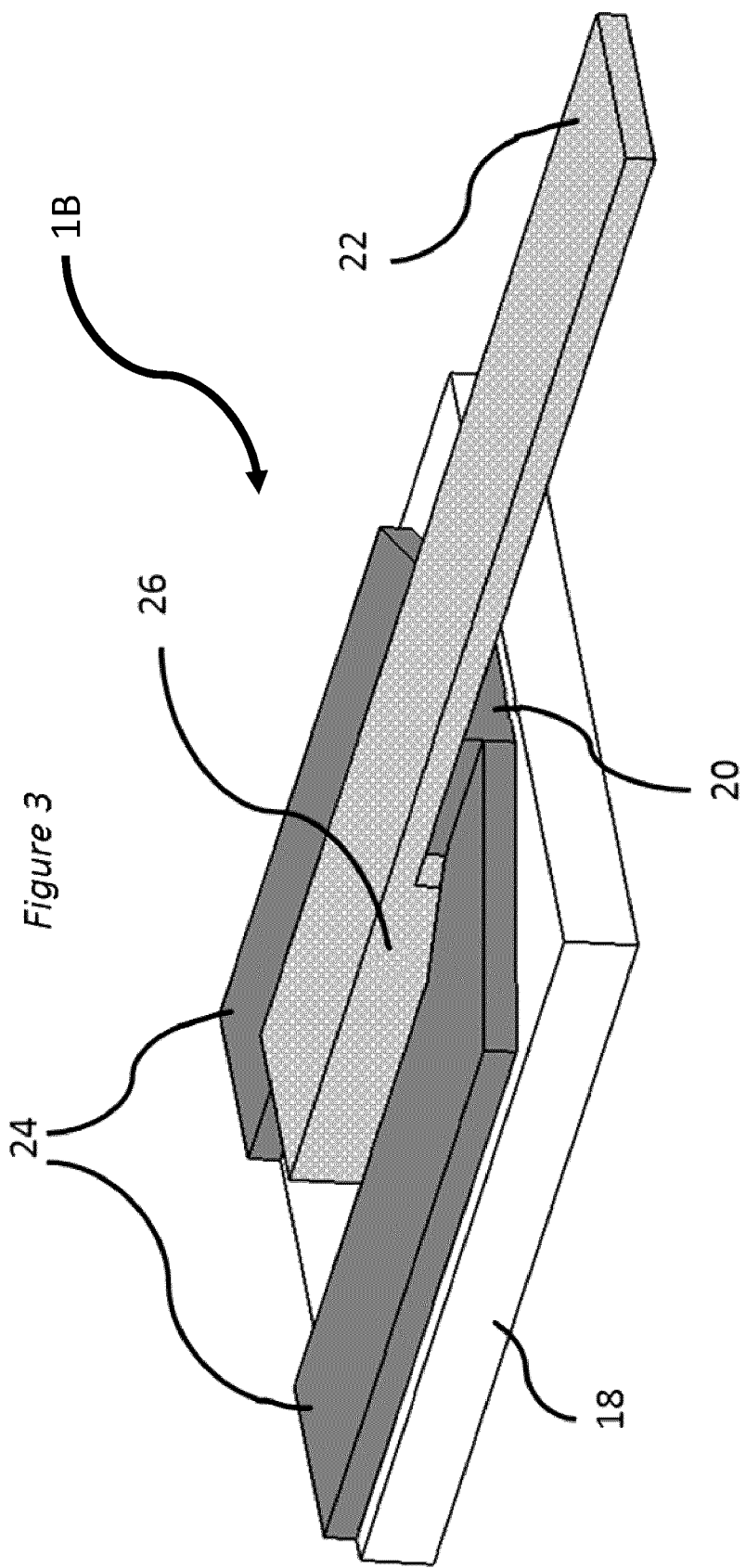
FIG. 3 illustrates a base excited micro-cantilever according to an embodiment, wherein the micro-cantilever is coupled (e.g., clamped) to the base substrate and the actuator is attached underneath the cantilever at a distance from the cantilever clamp point.

FIG. 3 show an exemplary system 1B wherein the actuation method is applied in a different variation. Compared to micro-cantilever 10 in the system 1A in FIG. 1 that is directly mounted on the top of actuator 16, in the system 1B in FIG. 3, the actuator 20 is disposed at a distance from a clamping point 26 of a micro-cantilever 22 to a substrate 18. The signal and required energy for actuation may be provided via connecting paths 24. In the system 1B, the actuator 20 comprises electric resistors for thermal actuation via joule effect or piezoelectric materials for piezoelectric actuation. The architecture of the main cantilever 22 may vary, and is not limited to the rectangular cross section and general shapes such as circular trapezoidal etc. Moreover, continuously varying cross section has been considered for the purpose of providing less rigidity at the designated points along the span in order to facilitate/hinder bending. The bimorph effects mentioned above is still present in this embodiment and may assist the bending of the beam at the location it is connected to the actuator 20.

Figure 4:
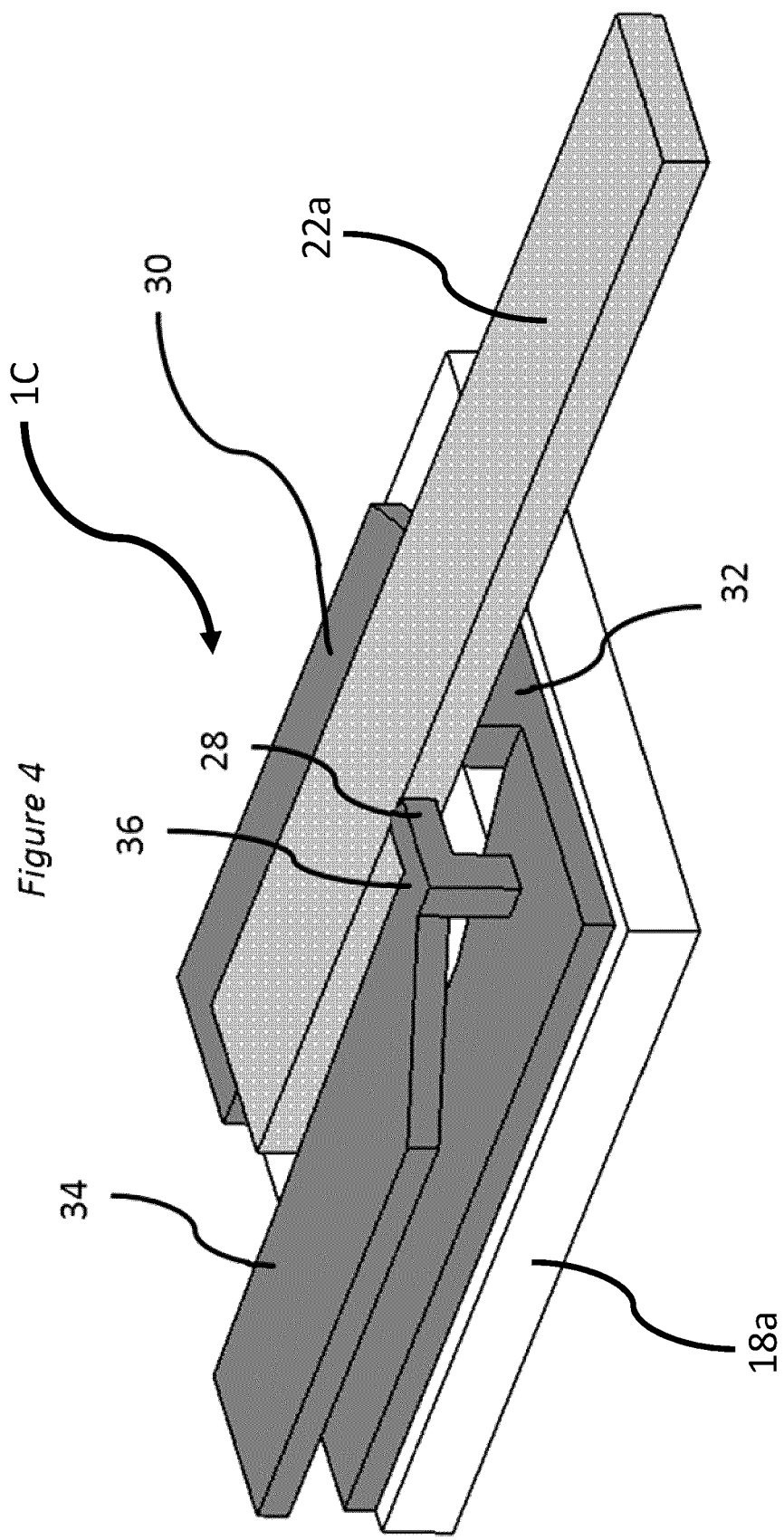
FIG. 4 illustrates a base excited micro-cantilever according to an embodiment, wherein two actuators are used to vibrate the micro-cantilever in two directions.

FIG. 4 depicts yet another variation, the system 1C, for micro-cantilever actuation, where the cantilever 22a is actuated in two directions (e.g., horizontally and vertically). The base attachment and clamp points may be similar to the corresponding elements in FIG. 3. Two independent currents may be supplied through a plurality of connectors (e.g., connecting lines or wires) on two sides of an actuator 32, and through a third connector (e.g., wire) 34 for actuator 28, respectively. Both currents share same connector (e.g., wire) 30 as part of their signal supplying circuitry. While in this variation the current directly passes through the actuator 32 to provide the heating and/or piezoelectric effects, the actuator 28 is not directly in the electric circuit. However, the heat generated at bottleneck cross section 36 is heating the actuator 28 by conduction phenomenon. Therefore, the actuator 28 can be only using thermal effects while the actuator 32 can be either thermal or piezoelectric. In general, in embodiments such as FIG. 4 where more than one actuator may be implemented, different actuation techniques and frequencies based on the design criteria might exist in the system at the same time. The dimensions of the beam and applied excitation frequencies may allow the independent actuations to have different vibration frequencies and response patterns.

Figure 5:
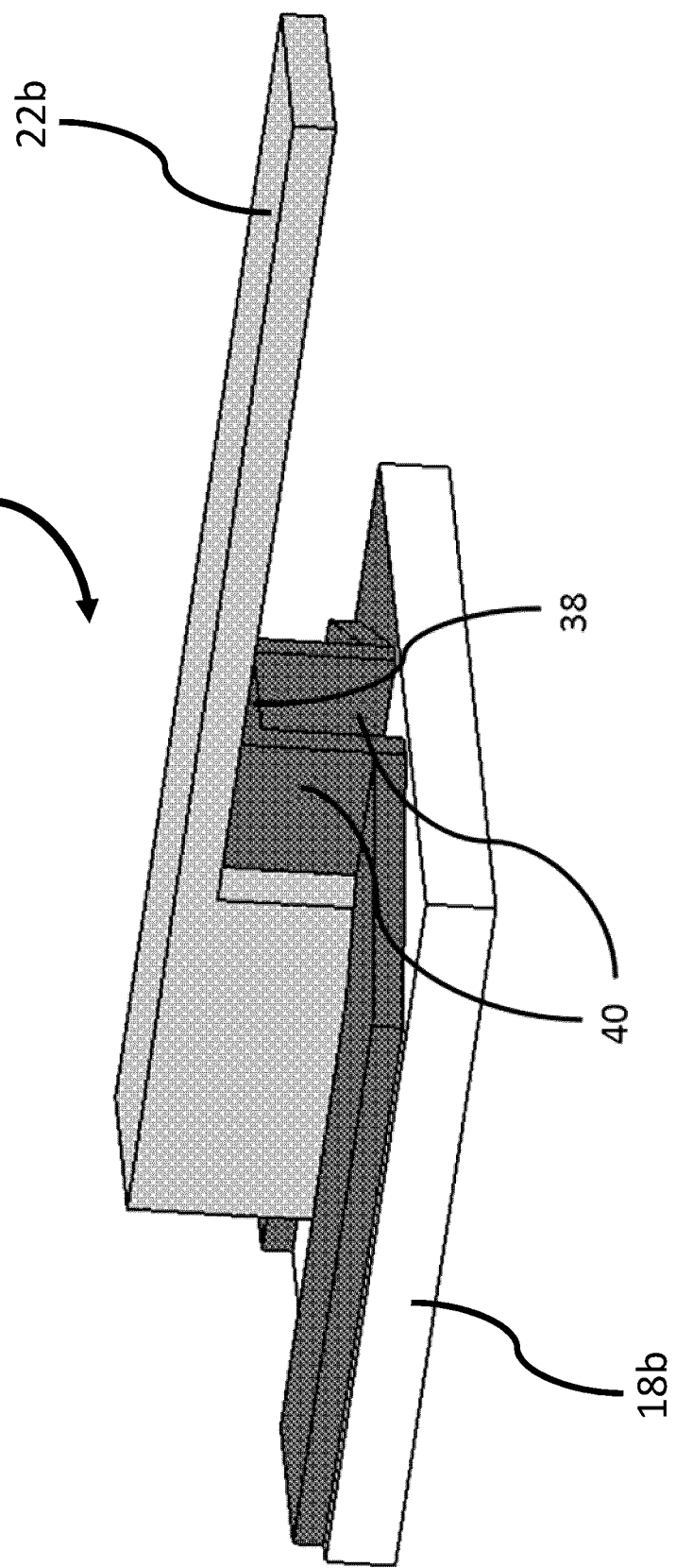
FIG. 5 illustrates a base excited micro-cantilever according to an embodiment, wherein the actuator comprises a bridge attached underneath the cantilever.

In yet another variation, FIG. 5 illustrates a system 1D for maximizing the energy efficiency in thermal actuation method. In this configuration instead of using an actuator 38 as a block of material underneath a micro-cantilever 22b, the actuator 38 has formed a narrow passage of current and a bridge-like structure underneath the micro-cantilever 22b. The reduced cross section for electrical conduction increases the resistance and heating while longer legs 40 on both sides of the bridge 38 increase the thermal expansion/contraction magnitudes and therefore the overall displacement at the beam. The legs 40 may be designed to be piezoelectric materials while the connecting bridge 38 is a regular conducting material to complete the circuit.

Figure 6:
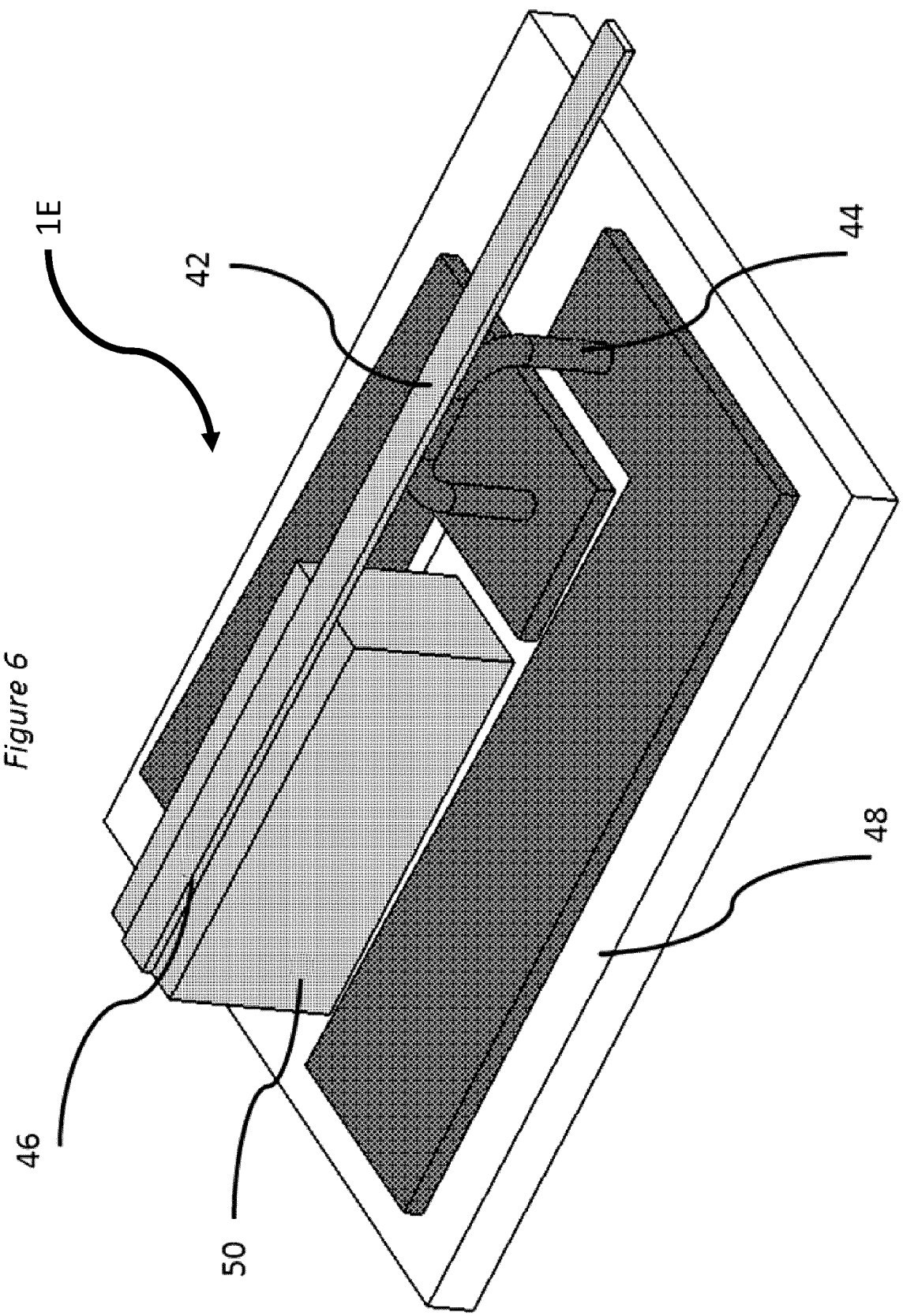
FIG. 6 illustrates a base excited micro-cantilever according to an embodiment, wherein the actuator comprises a bent micro-wire.

In another variation shown in FIG. 6, in the system 1E, an actuator 44 is formed from a bent wire disposed underneath a micro-cantilever 42. Such a configuration may eliminate the use of clean room for material deposition and reduce the cost of manufacturing. The micro-cantilever 42 may be manufactured separately, and may be placed on top of a holding support 50. Adhesive may be applied underneath the actuator 42 as well as the base 46 of the actuator 42 for securing it. Although using substrate material and MEMS deposition is a viable option in this embodiment, a printed board circuit (PCB) 48 may be manufactured to setup the system on it, which may avoid the cost of clean room and improve the efficiency of manufacturing prototypes and small quantity vibrating cantilevers.

Figure 7:
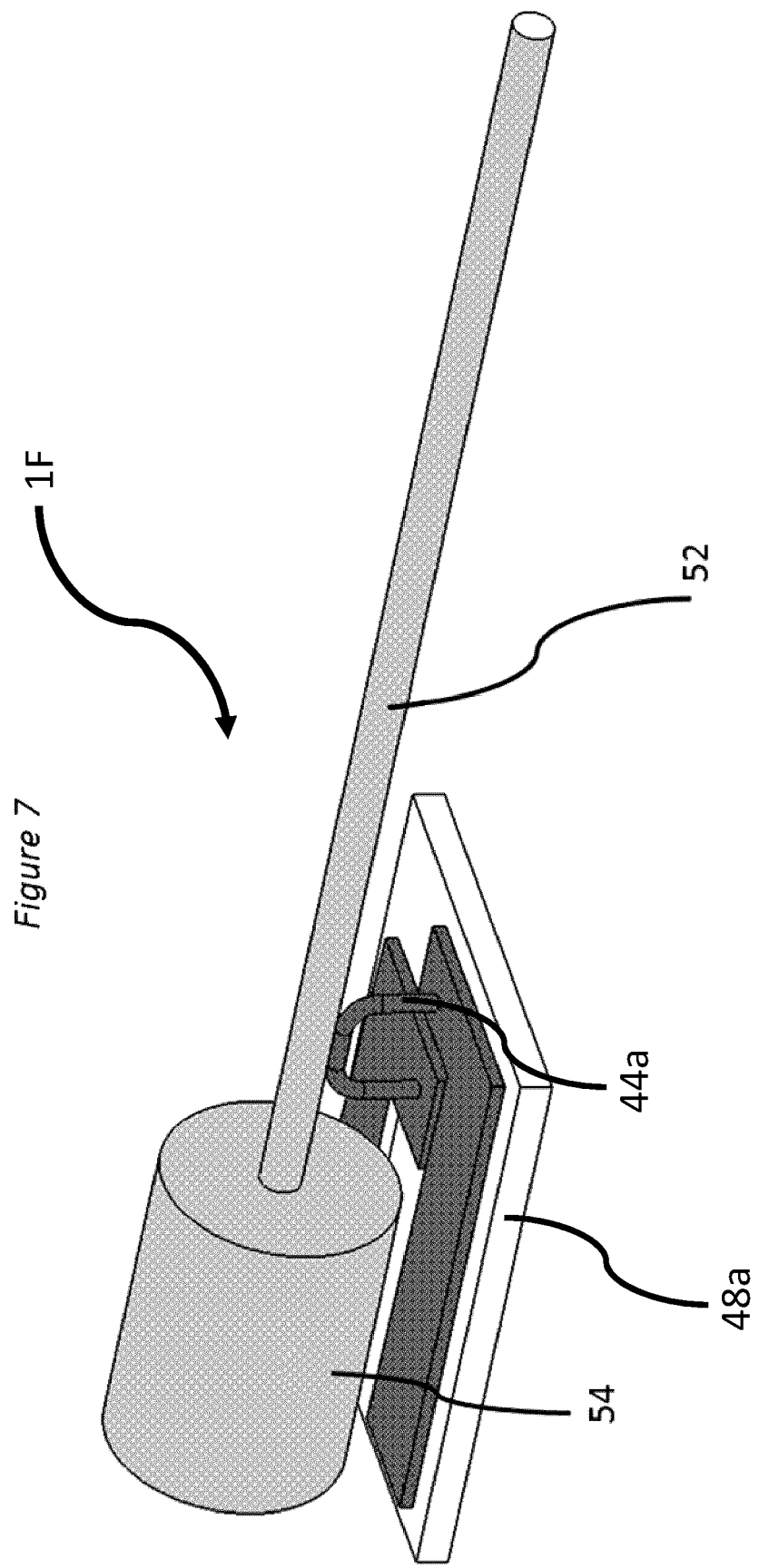
FIG. 7 illustrates a base excited micro-cantilever according to an embodiment, wherein the micro-cantilever comprises an optical fiber attached to a thicker optical fiber.

In the variation illustrated in FIG. 7, the system 1F may be used for the vibration of optical fiber(s) 52. The optical fibers may be long continuous fibers with circular cross section. In this embodiment, the fiber can be comparably long on the end which is not actuated to vibrate or spliced into thicker fibers 54. Adhesive may be applied in between the fibre 52 and the actuator 44a to make proper contact for inducing vibrations in the micro-cantilever fibre 52.

Figure 8:
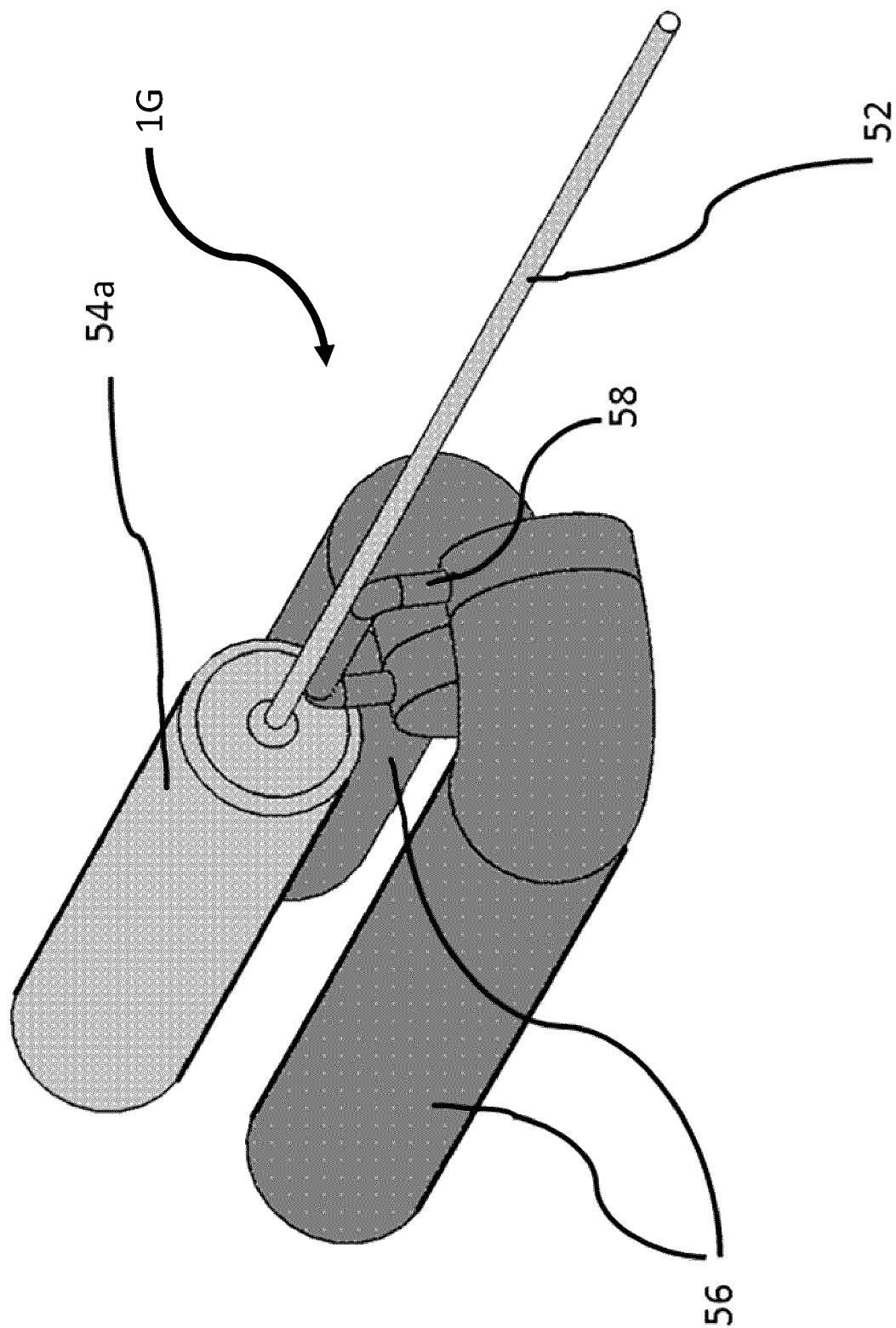
FIG. 8 illustrates a base excited micro-cantilever according to an embodiment, wherein the conductive materials used for supplying power to the actuator also serve as the structural support for the micro-cantilever.

FIG. 8 shows a system 1G where the conductive material has structural purposes as well. In this variation, for example, two bent wires 56 are used to provide structural support for a micro-cantilever 52 as well as providing required energy for its actuation. An actuator is attached to these conductors at 58 via, for example, micro-welding, soldering etc. Alternatively, the whole system 1G may be manufactured as one piece using, for example, micro-manufacturing techniques.

Figure 9:
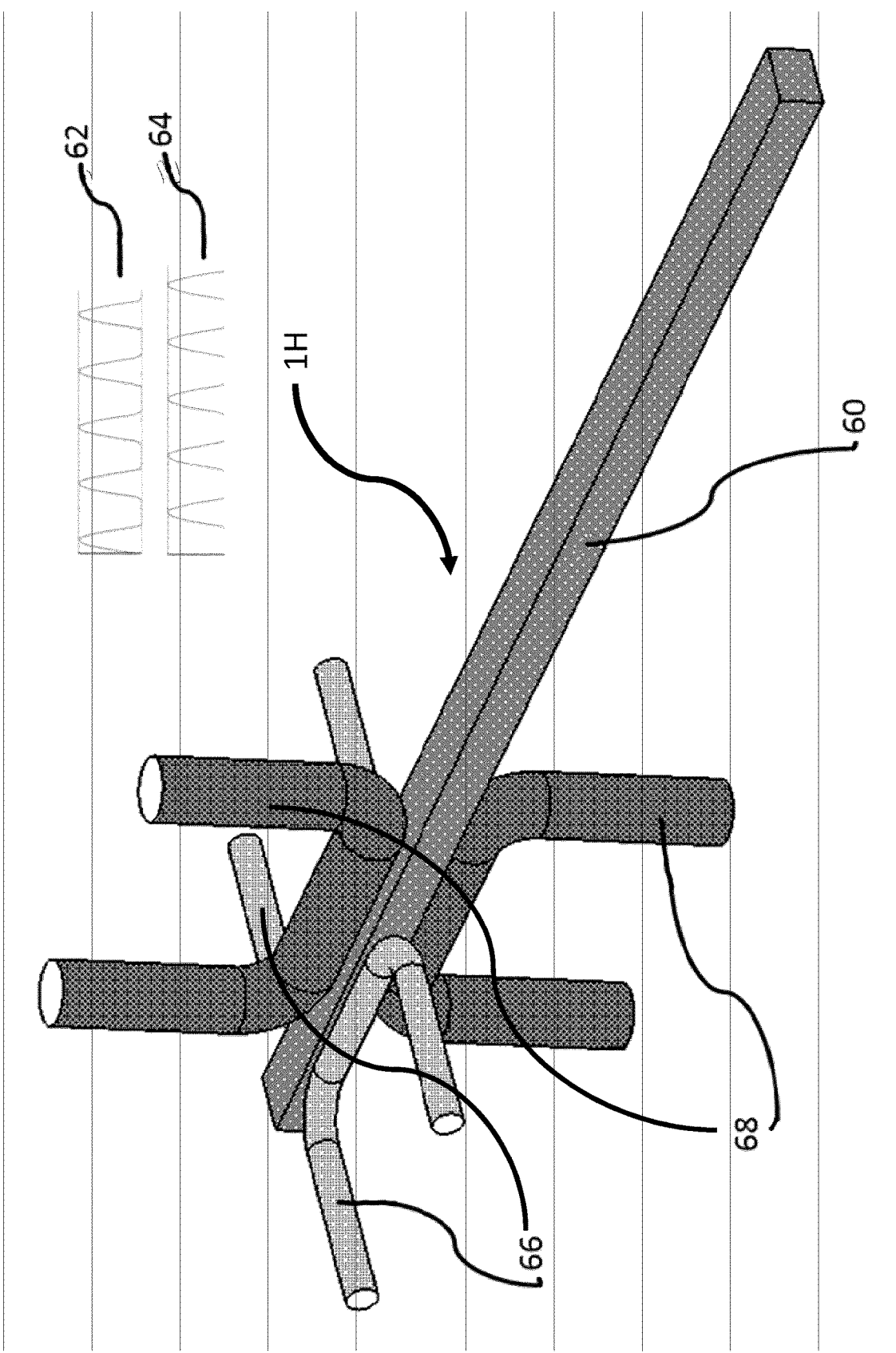
FIG. 9 illustrates a base excited micro-cantilever according to an embodiment, wherein the actuator array comprises two pairs of bent micro-wires arranged around the main cantilever beam to vibrate the beam independently in two directions.

FIG. 9 illustrates an actuation method used for bilateral vibration of the micro-cantilever 60. FIG. 9 is stripped down to just showing the actuators 66 and 68 as well as the micro-cantilever 60 and all other repeated details such as connecting wires and substrate are not depicted while they exist in the physical system. This embodiment uses two sets of actuators 66 and 68 that are placed opposite to each other. In thermal actuation, where applying only the positive part of the signal (heating) is possible, and lack of signal is taken as the cooling (reversing the signal does not induce cooling), applying two actuations with semi-sinusoidal signal on opposite side may improve the symmetry of the vibrations and efficiency. A pi phase shift has been applied between signal in one side and its opposite signal, 62 and 64, respectively. Moreover, this is not limited to actuation along one axis. As depicted in FIG. 8, more than one actuation pairs co-exist in this particular design. Multiple actuations help in vibrations in various direction and using superimposed motion to have higher flexibility in motion of the device. The actuator sizes and beam dimensions may be optimized based on the particular designs to achieve design requirements. A skilled person will appreciate that the semi-sinusoidal signal is an example and does not limit the method and systems disclosed. Any type of periodic cycles including but not limited to impulse and rectangular waves may be applicable in the method and systems disclosed.

To enhance the overall performance, materials with high thermal expansion coefficients (e.g., Aluminum, Titanium etc.) or high thermal contraction coefficients may be used for the actuators in the various variations.

Thermal actuation includes the use of materials undergoing a phase change, such as shape memory alloys (e.g, NiTi, FeMnSi, CuZnAl etc.).

In addition to thermal expansion/contraction and piezoelectric effect, other phenomena or techniques can be used. This includes electro-active polymers, gel actuators, polymeric artificial muscles (e.g. nylon actuators), nano-carbon-tubes, graphane, graphene, carbon based actuators, or a combination thereof.

For the case of thermal excitation, according to an embodiment, the temperature rise inside the actuator can be provided via any one or more of various methods including electro-thermal heating (Joule effect), conduction from an adjacent medium, radiation (e.g., laser beam heating).

The actuation methodology is not restricted to linear lateral or longitudinal (back and forth) motions. Any rotational and/or flexural motion at the actuator that can excite the micro-cantilever can be counted as base excitation. According to an embodiment, an actuator array may include any combination of actuator configurations to offer any arbitrary motion excitation in the micro-cantilever.

In one variation, an array of actuators may be located and attached around the micro-cantilever beam or fiber, in order to allow vibration actuation in any arbitrary direction.

Having the system in a non-inertial frame or case (e.g., vibrating the whole system) can also act as based excitation considering the d'Alembert effect on the micro-cantilever. According to an embodiment, such whole system vibration may be used alone or in combination with any of the above described methods for base excitation of a micro-cantilever.

Robust Design Methods

Figure 10:
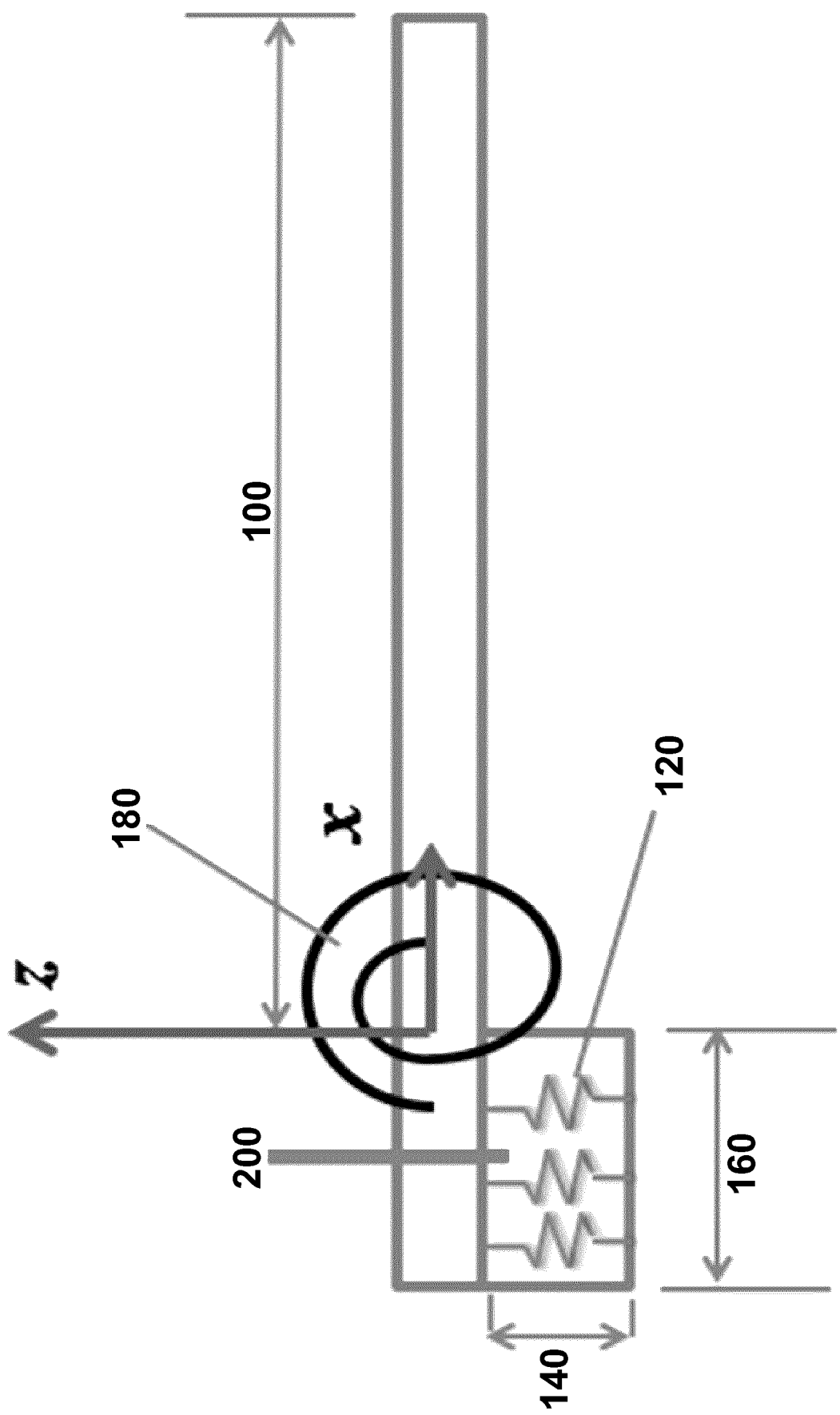
FIG. 10 illustrates a schematic diagram of a base excited cantilever according to an embodiment.

FIG. 10 shows a general schematic of the micro-cantilever in connection with the various disclosed methods and systems. The main span/length of the vibrating section of the micro-cantilever is indicated in as "100" in FIG. 10. The actuator 120, with its length and height, shown with "140" and "160", respectively, acts as an elastic base/connection. Elastic actuator also has rotational stiffness 180, at the connection point to the beam. The vertical displacement generated by thermal cycles of 120, provides vertical displacement that is the source of actuation in the system. A mathematical formulation based on such a schematic may be used to simulate and predict the micro-cantilever system behaviors and responses to different conditions. Alternatively, finite element modeling of the system may be implemented in computer software to simulate and predict the micro-cantilever system behaviors and responses.

Figure 11:
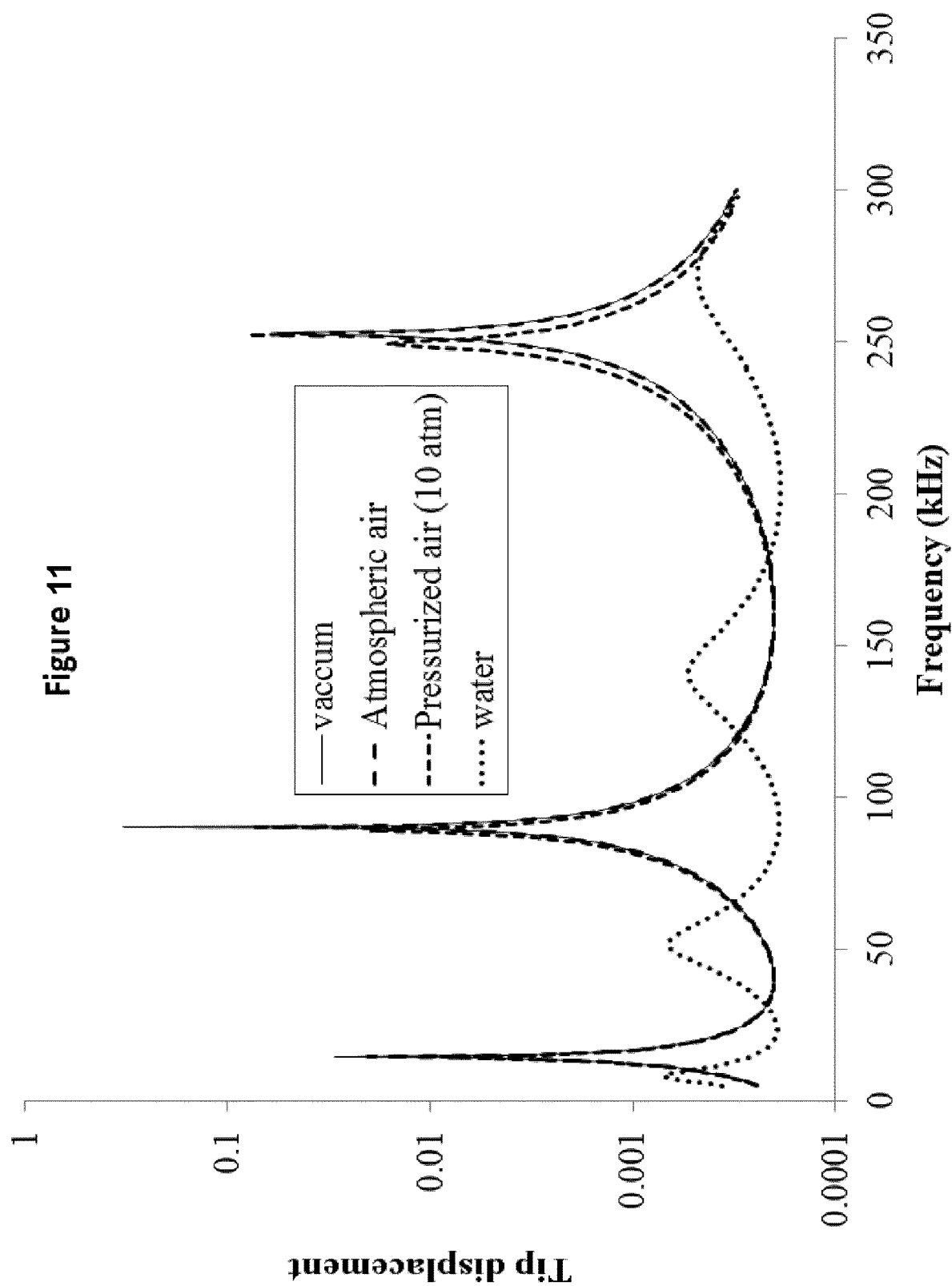
FIG. 11 illustrates the harmonic dynamic response of an embodiment of a base excited micro-cantilever while exposed to different environments.

FIG. 11 illustrates the harmonic response (tip displacement) of the micro-cantilever depicted in FIG. 1, as exposed to various environments. The mathematical formulation generated was used to predict the response.

Figure 12:
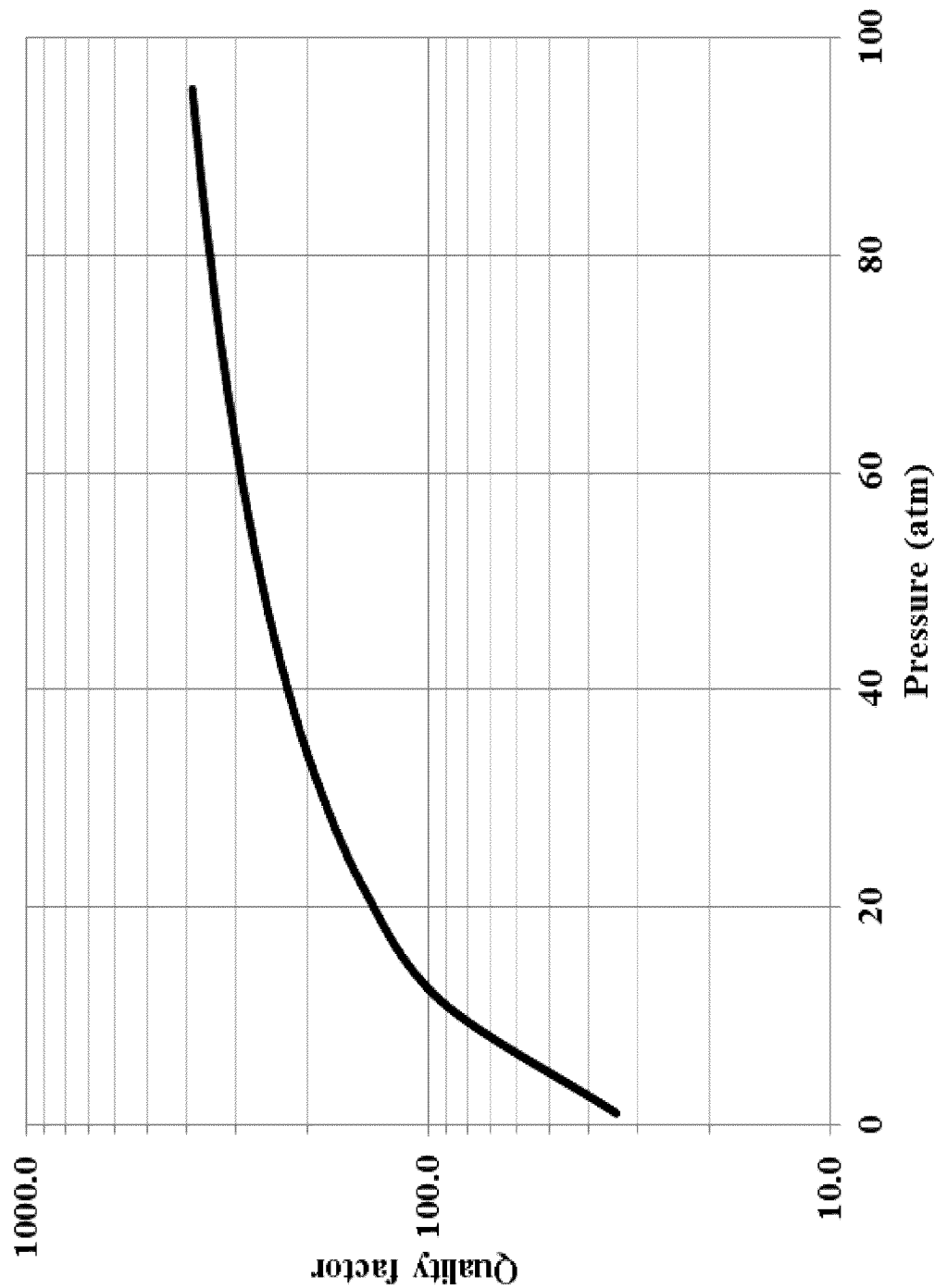
FIG. 12 illustrates the predicted quality factor of an embodiment of a base excited micro-cantilever system as a function of air pressure.

FIG. 12 shows the quality factor of an embodiment of a base excitation micro-cantilever system surrounded by air at different pressures. According to the observed trend, in some variations, pressurizing air can be used to increase the quality factor, and hence increase the system efficiency. However, this may decrease the overall tip displacement as was shown in FIG. 11. In one embodiment, a base excitation micro-cantilever system may be placed in a pressurized gas environment in order increase system efficiency.

Figure 13:
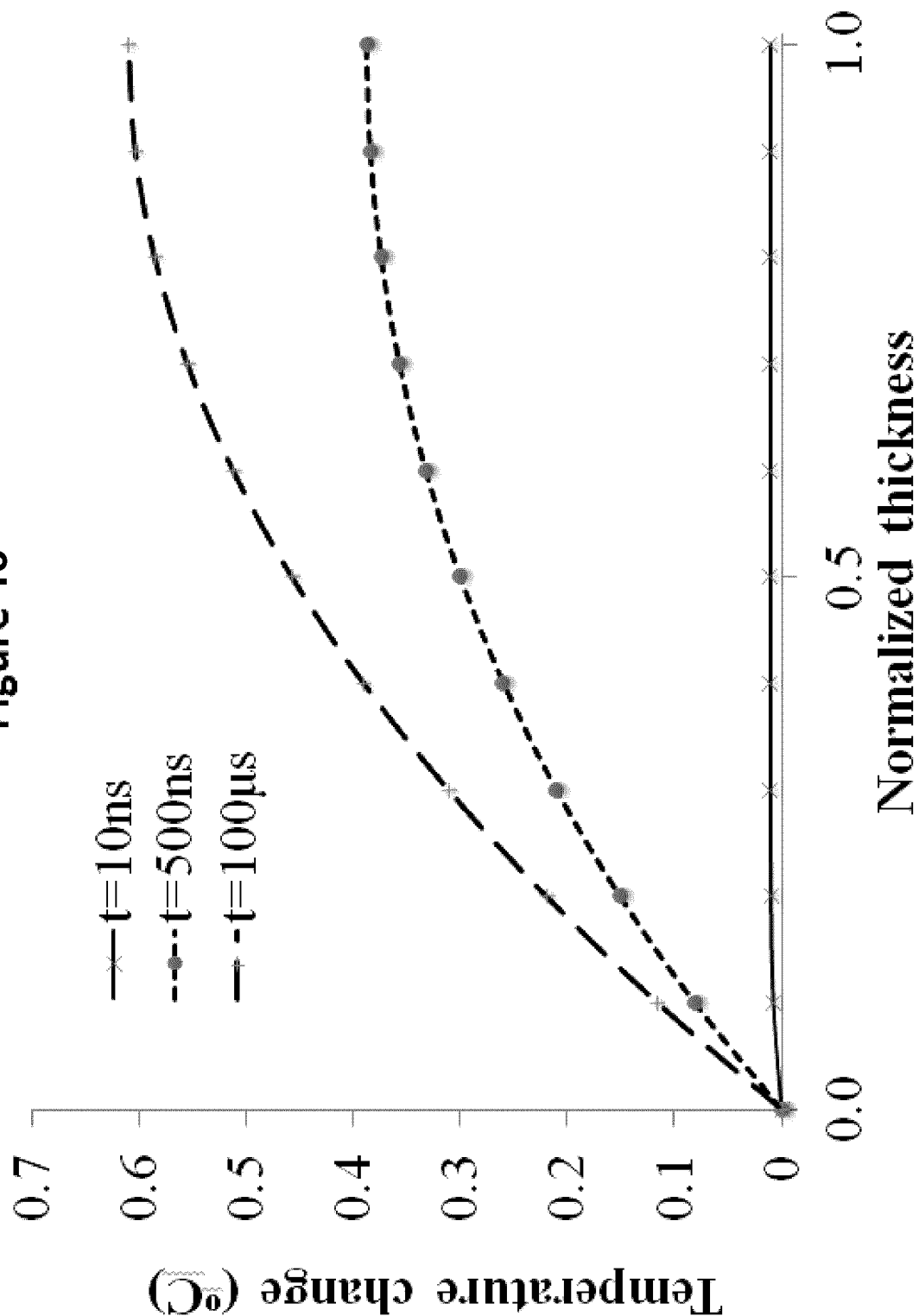
FIG. 13 illustrates the thermal response of an embodiment of a micro-cantilever actuator to a unit step input.

FIG. 13 shows the thermal response of the actuator layer to a unit step input power. Temperature along the normalized length of the actuator (0-1) shows the reaction time of a micro-level actuator described in the various embodiments.

Figure 14:
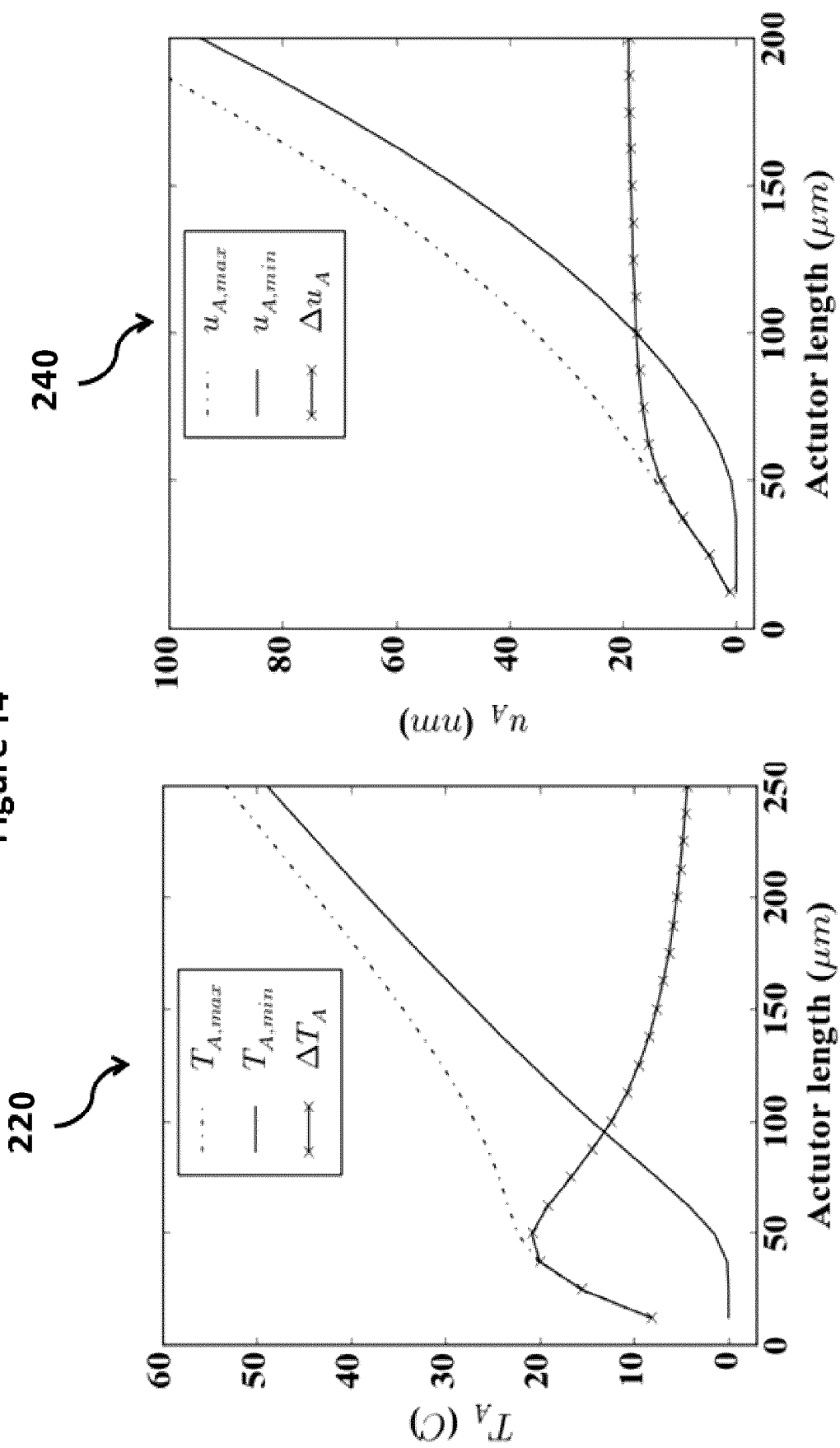
FIG. 14 illustrates the temperature and displacement of a micro-cantilever actuator according to embodiments including a range of actuator lengths.

FIG. 14 shows the effect of increasing length of actuator on temperature variation in 220, and actuation magnitude in, 240, at steady-state. The required thermal model under a general time-dependent input was formulated as a part of this invention.

Figure 15:
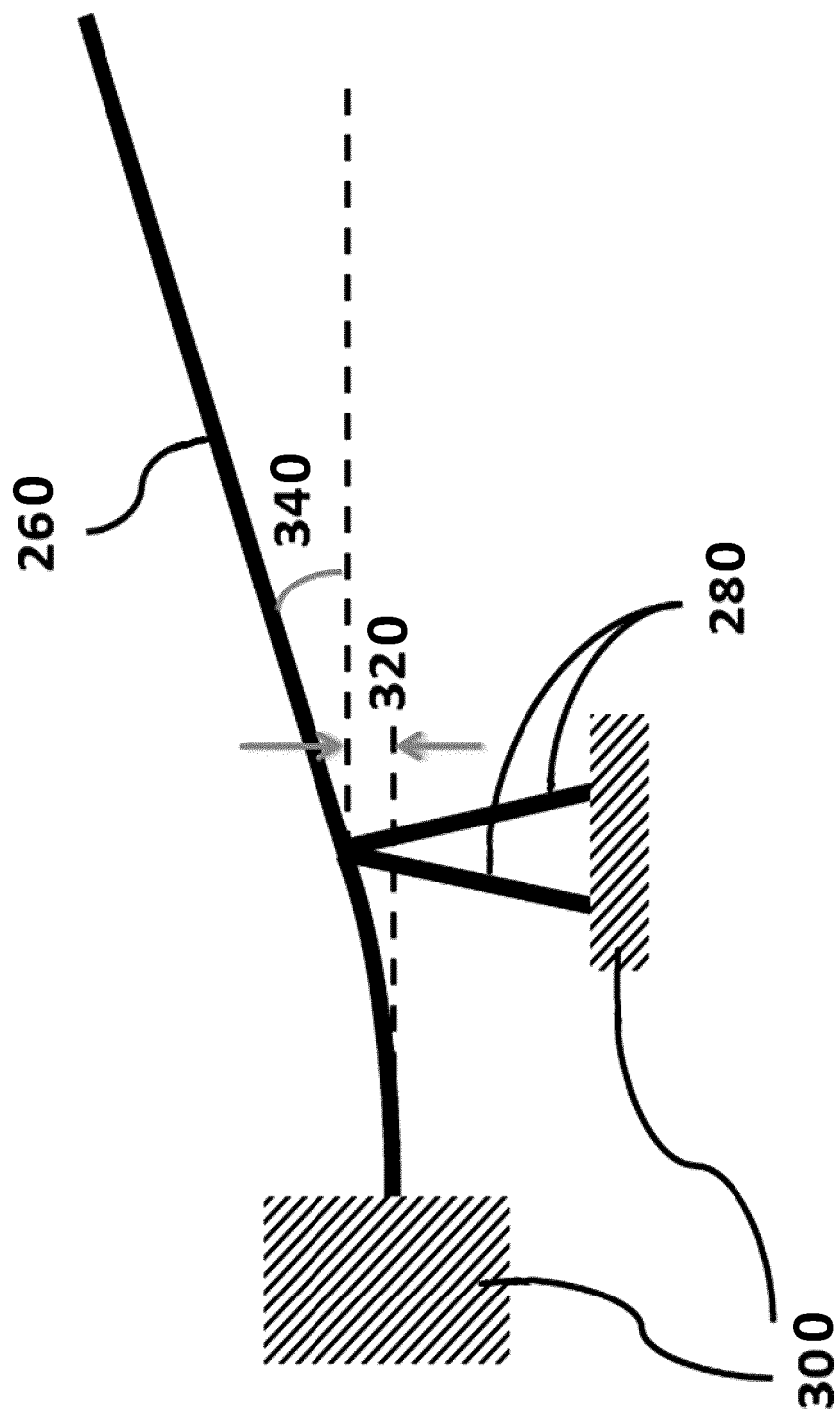
FIG. 15 illustrates a schematic diagram of a base excited micro-cantilever configuration according to an embodiment, wherein the actuator comprises thin structures.

FIG. 15 shows a selected variation of the systems of the present invention. The micro-cantilever, 260, along with the slender structures (such as wires) that are connected to it, 280, are fixed at clamp points, 300. Extension/contraction of 280 results in displacement 320 and slope 340. Periodic excitation at 280 results that matches the natural frequency of the system induces resonant vibration.

Figure 16:
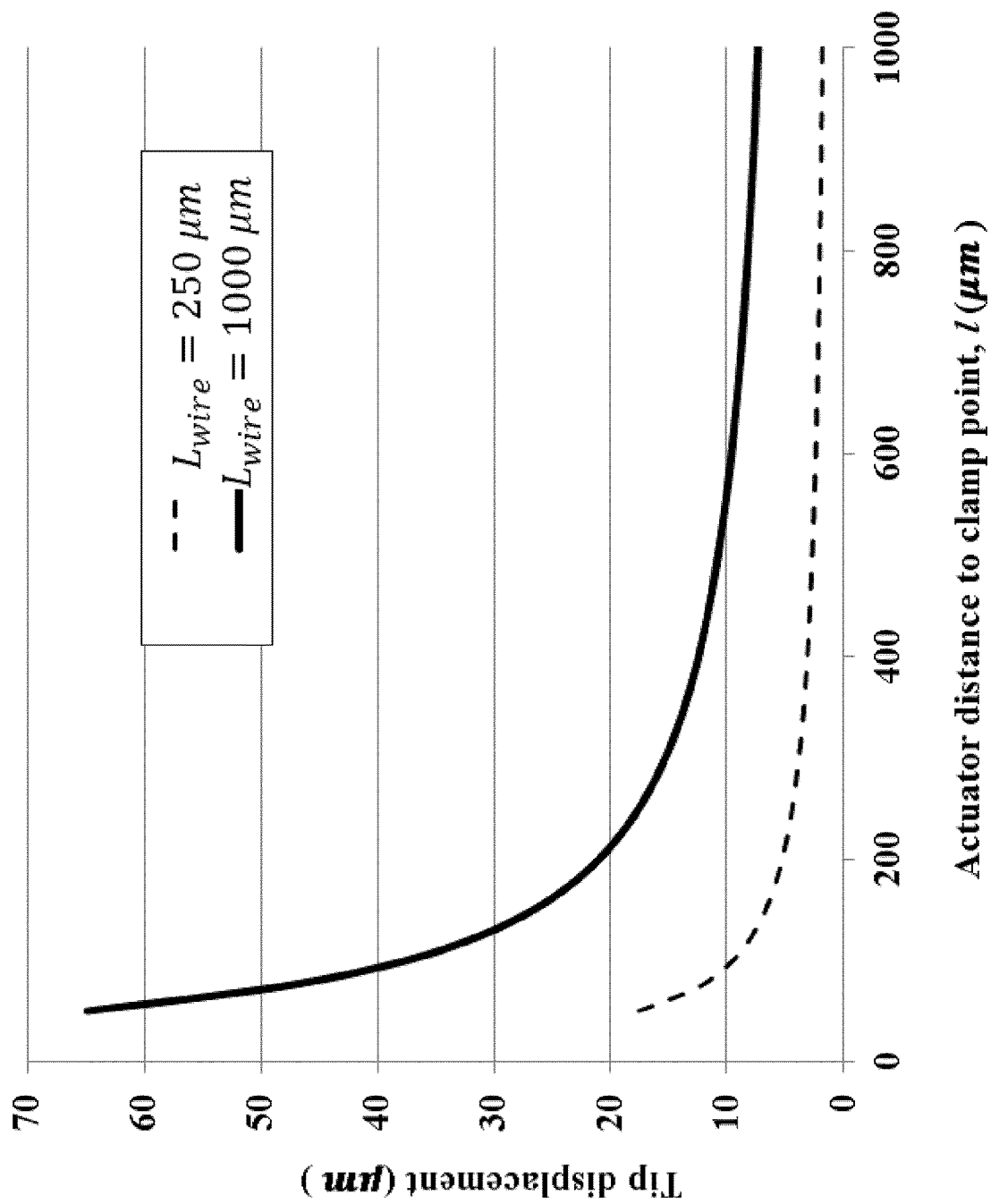
FIG. 16 illustrates the predicted response of an embodiment of a base excited micro-cantilever as a function of actuator location.

FIG. 16 shows a study on the placement of 28 in FIG. 6 and its effect on the tip displacement. The formulation was extracted by inventors and helps in optimizing the performance in the system.

Figure 17A:
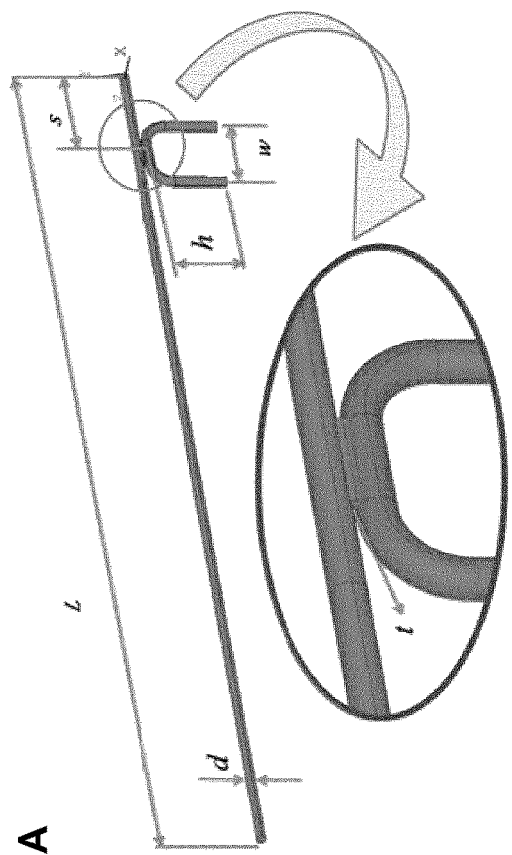
FIG. 17A illustrates the variable dimensions of a base excited micro-cantilever system according to an embodiment.
Figure 17B:
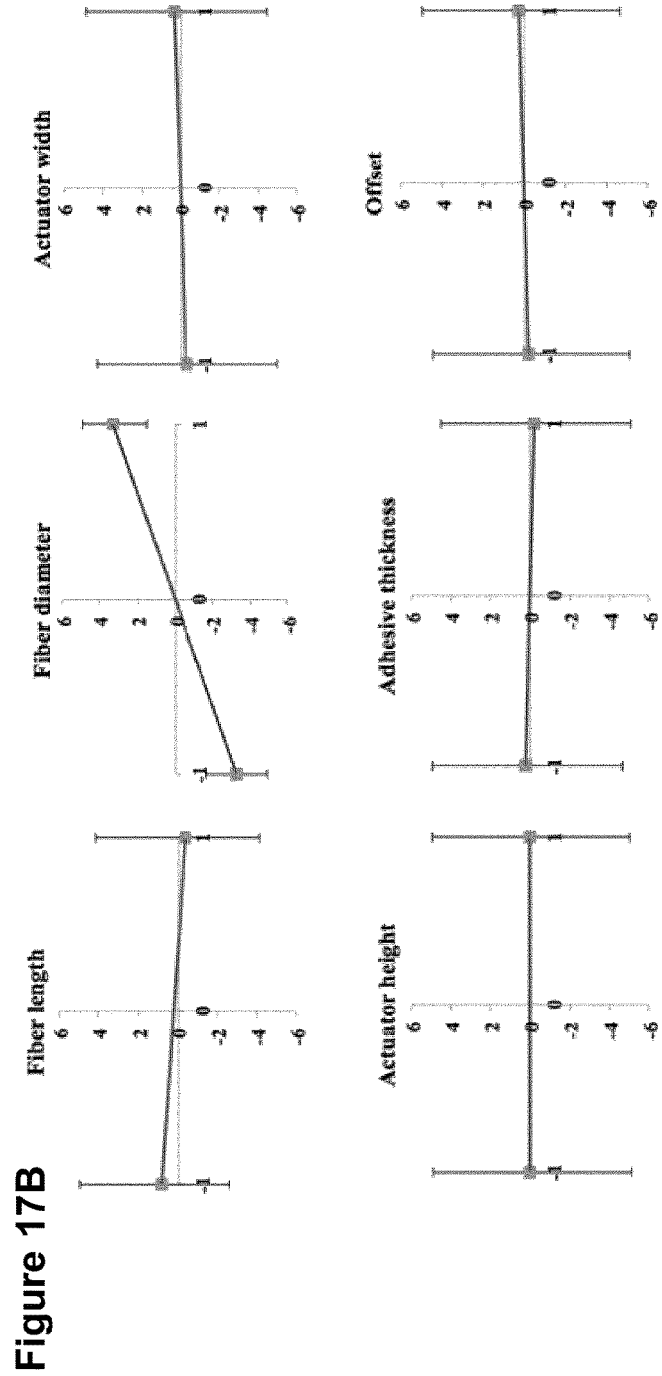
FIG. 17B illustrates results of a sensitivity analysis on manufacturing variances in system dimensions according to an embodiment of a base excited micro-cantilever system.

FIG. 17 shows a sensitivity analysis on a configuration of micro-cantilever. Variations due to the tolerances in the manufacturing process are studied in here. The sensitivity study can be conducted on both the natural frequency and the tip displacements.

Figure 18:
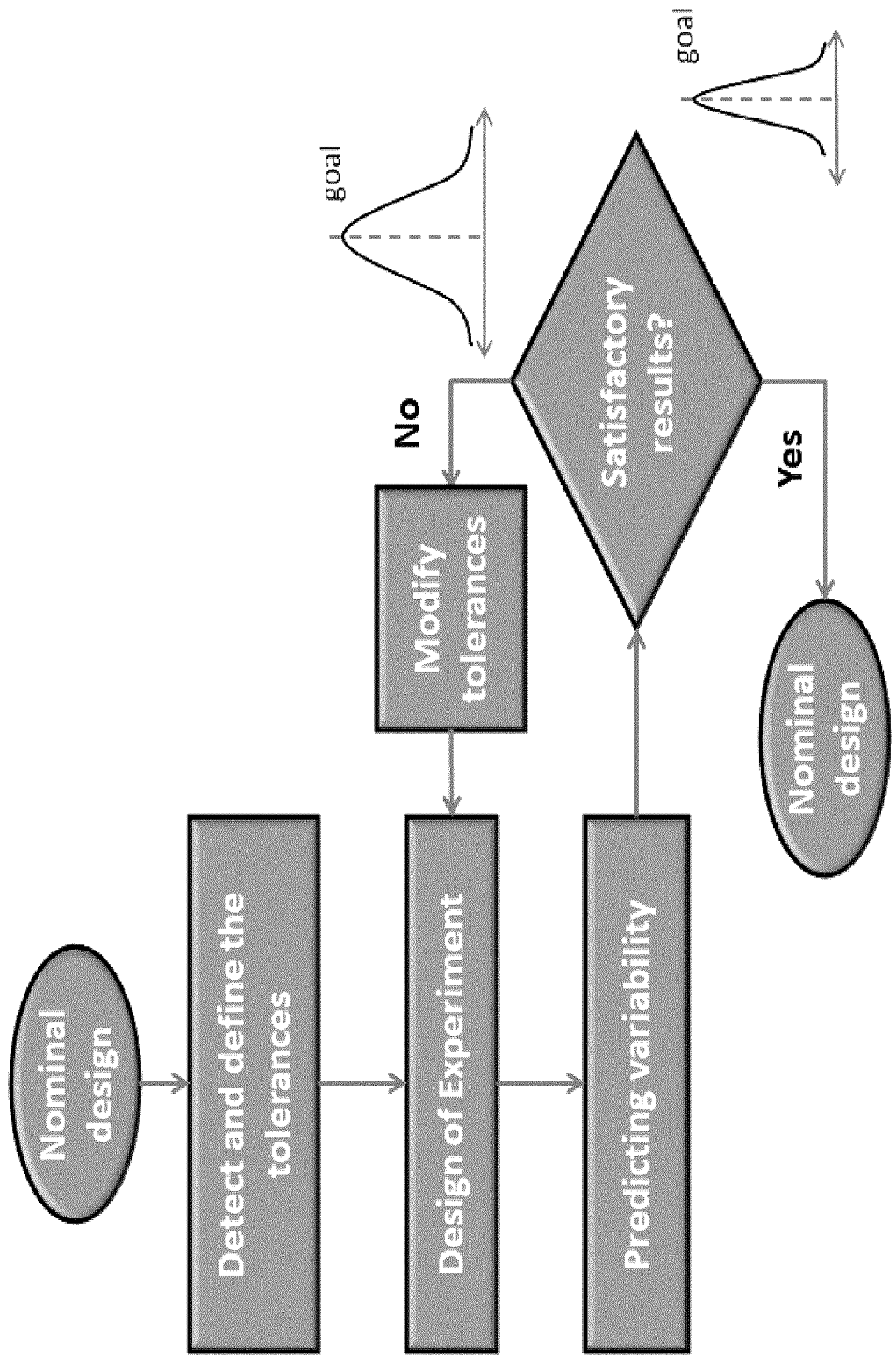
FIG. 18 illustrates an algorithm for robust design of a base excited micro-cantilever system.

FIG. 18 shows an example algorithm for robust design of the micro-cantilever. This general-purpose algorithm may be useful to reduce the variations in the final product. According to this method, sensitive parameters that are detected as a result of sensitivity analysis (FIG. 8) are allowed less tolerances in order to reduce their adverse effects.

Figure 19:
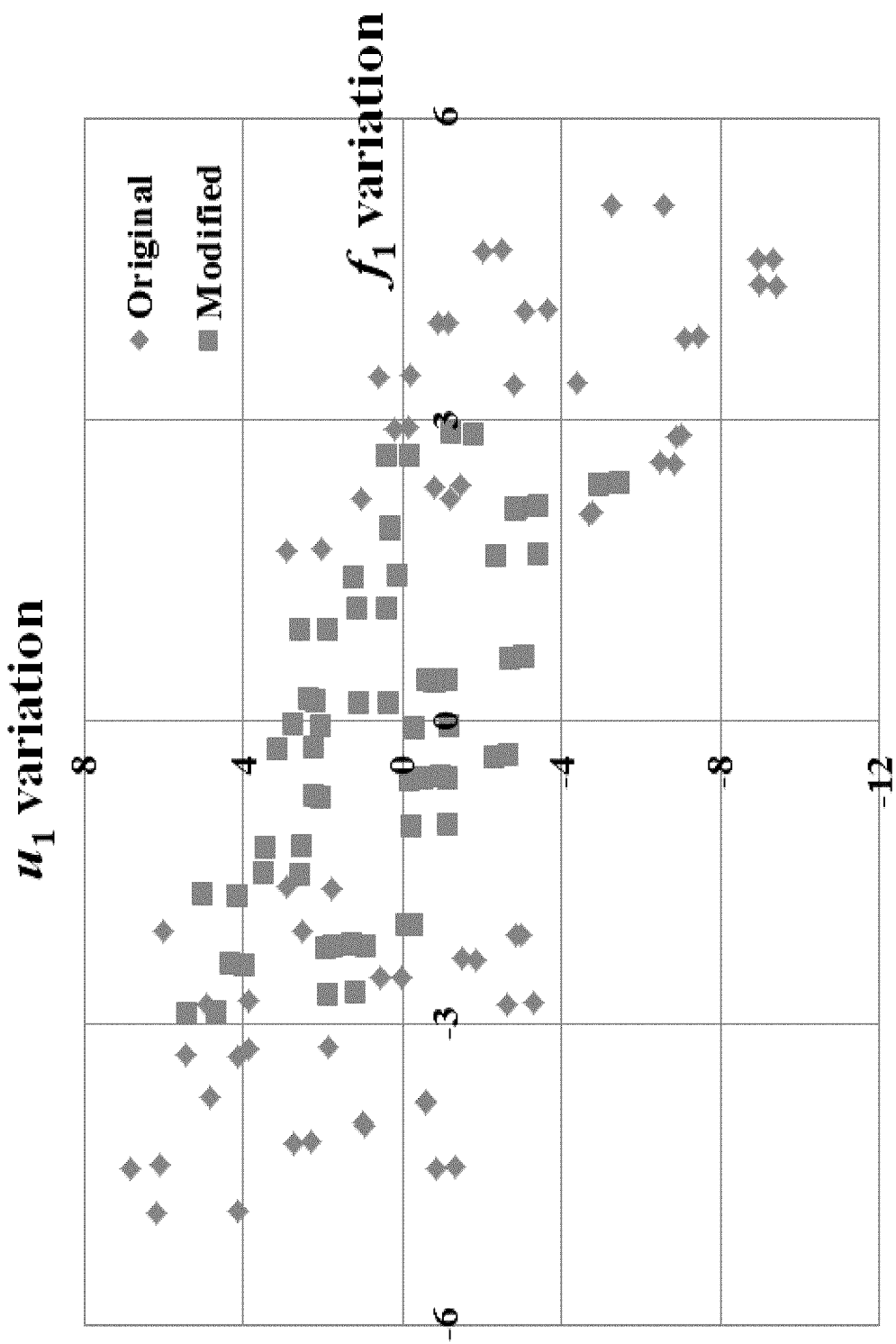
FIG. 19 illustrates improvement in the design robustness of an embodiment of a base excited micro-cantilever.

FIG. 19 shows a comparison between the percentage variation of the natural frequency ($f_1$) and micro-cantilever tip displacement ($u_1$) in a model before (original) and after (modified) performing the above robust design algorithm and applying changes to the dimensional design of an embodiment of a base excitation micro-cantilever. In the original design configuration, based on a 14 micrometer micro-cantilever beam diameter with an assumed manufacturing tolerance of about +/−0.5 micrometers and an actuator offset distance of about 20 micrometers with an assumed tolerance of about +/−2 micrometers, the natural frequency shows a variation of about +/−5% and the tip displacement shows a variation of about +/−9%. Following, for example, a design modification to require tighter tolerances of about +/−0.2 micrometers for the beam diameter and to reject negative variance in the offset distance (thus requiring about +2/−0 tolerances), the variation of the natural frequency is reduced to about +/−3% and the variation of the tip displacement is reduced to about +/−5%.

Various embodiments of the systems and methods for base excitation of moderately high vibration of micro-cantilevers are disclosed. In these embodiments a micro-cantilever is attached to actuators adjacent or close to its base or secured (e.g., clamped) end. At its base, the micro-cantilever may be attached or secured directly to a base substrate, or instead, only to the actuators. The actuators may comprise bulk materials, bridges, or formed wires that expand and contract by application of electric currents, due to the effect of electro-thermal heating or, due to piezoelectric effects. A single actuator or an array of actuators may be placed around the micro-cantilever to oscillate it and apply actuation pulses. Various architectures of the actuators are implemented to stimulate different frequencies of the beam and induce displacement in different direction and amplitudes. Further, a framework for robust design of a micro-cantilever system with thermal base excitation actuation may include specification of a nominal dimensional design, detection or estimation of manufacturing tolerances, design of experiment simulations to predict variability in outcomes such as natural frequency and tip displacement, and iterative modification of tolerances and design of variability prediction until satisfactory results are achieved.

While the present disclosure has been illustrated and described in connection with various embodiments shown and described in detail, it is not intended to be limited to the details shown, since various modifications and structural changes may be made without departing in any way from the scope of the present disclosure. Various modifications of form, arrangement of components, steps, details and order of operations of the embodiments illustrated, as well as other embodiments of the disclosure may be made without departing in any way from the scope of the present disclosure, and will be apparent to a person of skill in the art upon reference to this description. It is therefore contemplated that the appended claims will cover such modifications and embodiments as they fall within the true scope of the disclosure. For the purpose of clarity and a concise description features are described herein as part of the same or separate embodiments, however, it will be appreciated that the scope of the disclosure includes embodiments having combinations of all or some of the features described. For the terms "for example" and "such as", and grammatical equivalences thereof, the phrase "and without limitation" is understood to follow unless explicitly stated otherwise. As used herein, the singular forms "a", "an", and "the" include plural referents unless the context clearly dictates otherwise.

The invention claimed is:

1. A micro-electromechanical system for actuation of a micro-cantilever by base excitation, the system comprising:
a base substrate;
a micro-cantilever having a free end and a fixed end, the fixed end being in contact with and fixed to the base substrate; and
one or more actuators coupled to the fixed end of the microcantilever and to the base substrate, wherein the free end of the micro-cantilever extends laterally away from the one or more actuators beyond a distal-most extent of the one or more actuators, wherein the distal-most extent of the one or more actuators does not extend laterally away from the base substrate.

2. The system of claim 1, wherein the micro-cantilever comprises an optical fiber.

3. The system of claim 1, wherein the micro-cantilever comprises a circular cross section.

4. The system of claim 1, wherein the micro-cantilever comprises a rectangular cross section.

5. The system of claim 1, wherein the one or more actuators comprises an electrically conductive material to facilitate electro-thermal heating of the one or more actuators.

6. The system of claim 1, wherein the one or more actuators comprises a piezoelectric material.

7. The system of claim 1, wherein the one or more actuators comprises an electro-active polymer.

8. The system claim 1, wherein the one or more actuators comprises a carbon-based material.

9. The system of claim 1, wherein the one or more actuators comprises bent micro-wires that conduct electrical current.

10. The system of claim 1, wherein the one or more actuators comprises a bridge underneath the micro-cantilever.

11. The system of claim 10, wherein the one or more actuators comprises two piezoelectric columns coupled by a bridge.

12. The system of claim 1, wherein the one or more actuators are spaced around the micro-cantilever to facilitate vibration in one or more arbitrary directions.

13. The system of claim 1, wherein the one or more actuators is fastened to the micro-cantilever with adhesive.

14. The system of claim 1, wherein the micro-cantilever conducts light, electrical signals or a combination thereof for imaging sensing or a combination of imaging and sensing.

15. The system of claim 1, wherein the one or more actuators comprises an electrically conductive polymer, a piezoelectric polymer, an electro-active polymer, a carbon based material, or a combination thereof to facilitate vibration in different directions, frequencies or both.

16. A micro-electromechanical system for actuation of a micro-cantilever by base excitation, the system comprising:
a base substrate;

an array of one or more actuators to induce vibration of the micro-cantilever, the actuators being in mechanical communication with the base substrate; and a micro-cantilever having a free end and a fixed end, the fixed end being coupled to the array of actuators and in contact with the base substrate, and the free end extending laterally away from the array of actuators beyond a distal-most extent of the array of one or more actuators, wherein the distal-most extent of the array of one or more actuators does not extend laterally away from the base substrate.

17. The system of claim 16, wherein the micro-cantilever comprises an optical fiber.

18. The system of claim 16, wherein the micro-cantilever comprises a circular cross section.

19. The system of claim 16, wherein the micro-cantilever comprises a rectangular cross section.

20. The system of claim 16, wherein the actuator array comprises an electrically conductive material to facilitate electro-thermal heating of the actuator array.

21. The system of claim 16, wherein the electrically conductive material comprises a piezoelectric material.

22. The system of claim 16, wherein the actuator array comprises an electro-active polymer.

23. The system of claim 16, wherein the actuator array comprises a carbon based material.

24. The system of claim 16, wherein the actuator array comprises bent micro-wires that conduct electrical current.

25. The system of claim 16, wherein the actuator array comprises a bridge underneath the micro-cantilever.

26. The system of claim 25, wherein the actuator array comprises two piezoelectric columns connected by a bridge.

27. The system of claim 16, wherein the actuator array comprises actuators spaced around the micro-cantilever to allow vibration in arbitrary directions.

28. The system of claim 16, wherein the actuator array is coupled to the micro-cantilever with adhesive.

29. The system of claim 16, wherein the micro-cantilever conducts light, electrical signals or a combination thereof for imaging, sensing or both.

30. The system of claim 16, wherein the actuator array comprises an electrically conductive polymer, a piezoelectric polymer, an electro-active polymer, a carbon based materials or a combination thereof to facilitate vibration in different directions, frequencies or both.

31. The system of claim 1, wherein:
the fixed end of the micro-cantilever and the one or more actuators are coupled at a first plane defined by a surface of the micro-cantilever; and
the surface of the micro-cantilever extends in the plane along the free end of the micro-cantilever away from the one or more actuators.

32. The system of claim 16, wherein:
the fixed end of the micro-cantilever and the array of one or more actuators are coupled at a first plane defined by a surface of the micro-cantilever; and
the surface of the micro-cantilever extends in the plane along the free end of the micro-cantilever away from the array of one or more actuators.

* * * * *